(12) United States Patent
Mulligan et al.

(10) Patent No.: US 7,992,441 B2
(45) Date of Patent: Aug. 9, 2011

(54) PRESSURE SENSOR FOR MEASURING PRESSURE IN A MEDIUM

(75) Inventors: Sean P. Mulligan, Sharon, MA (US); Frank Morsink, Aadorp (NL); Jun Bae, Chestnut Hill, MA (US); Gerald Spijksma, Rijssen (NL); Tom te Boekhorst, Henglo (NL)

(73) Assignee: Sensata Technologies, Inc., Attleboro, MA (US)

( * ) Notice: Subject to any disclaimer, the term of this patent is extended or adjusted under 35 U.S.C. 154(b) by 90 days.

(21) Appl. No.: 12/504,006

(22) Filed: Jul. 16, 2009

(65) Prior Publication Data

US 2010/0024563 A1    Feb. 4, 2010

Related U.S. Application Data

(60) Provisional application No. 61/137,469, filed on Jul. 31, 2008.

(30) Foreign Application Priority Data

Nov. 10, 2008    (EP) ..................................... 08168746

(51) Int. Cl.
*G01L 7/00*    (2006.01)
(52) U.S. Cl. ............................................. 73/706; 73/754
(58) Field of Classification Search ......................... None
See application file for complete search history.

(56) References Cited

U.S. PATENT DOCUMENTS

| | | | | |
|---|---|---|---|---|
| 4,773,269 A | * | 9/1988 | Knecht et al. .................... | 73/706 |
| 5,852,244 A | * | 12/1998 | Englund et al. ................. | 73/706 |
| 5,939,638 A | * | 8/1999 | Zovath et al. .................... | 73/723 |
| 6,046,667 A | * | 4/2000 | Mathias ........................... | 338/36 |
| 6,131,462 A | * | 10/2000 | EerNisse et al. ................. | 73/702 |
| 6,214,634 B1 | * | 4/2001 | Osajda et al. .................... | 438/50 |
| 6,612,175 B1 | * | 9/2003 | Peterson et al. ................. | 73/708 |
| 7,451,653 B1 | * | 11/2008 | Sippola ............................ | 73/715 |
| 2004/0040382 A1 | * | 3/2004 | Peterson et al. ................. | 73/708 |

FOREIGN PATENT DOCUMENTS

WO    WO02/079742    10/2002

* cited by examiner

*Primary Examiner* — Andre J Allen
(74) *Attorney, Agent, or Firm* — Russell E. Baumann

(57) ABSTRACT

A pressure sensor module is disclosed. The pressure sensor module comprises a sensing element (1) mounted on a front side (3) of a support member (5). The support member (5) comprises a hole (7) through the support member (5) from the front side (3) to a back side (9). The sensing element (1) covers the hole (7) at the front side (3). A back side barrier (6) provided at the back side (9) of the support member (5) surrounds a surface of the back side (9) of the support member (5) and forms an enclosed area (8), wherein the enclosed area (8) and the hole (7) form a pressure channel (10). A back side protective member (2) fills the hole (7) and at least partially the enclosed area (8). The support member (5), back side barrier (6) and back side protective member (2) form a module that can be placed during production of the pressure sensor in a housing of the pressure sensor.

17 Claims, 3 Drawing Sheets

Fig 5
Fig 6
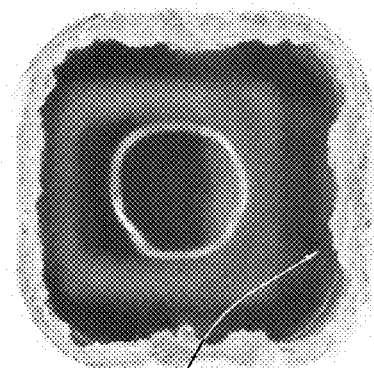
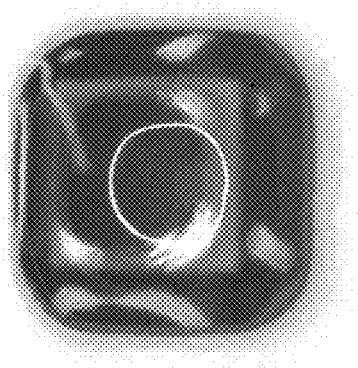
50
Fig 7
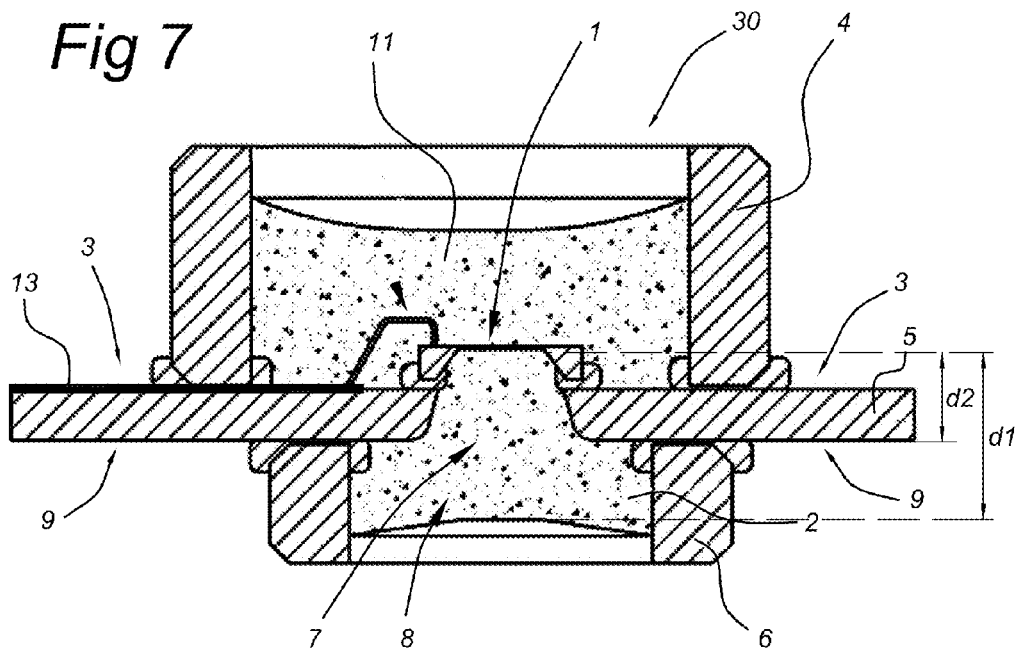

PRESSURE SENSOR FOR MEASURING PRESSURE IN A MEDIUM

RELATED APPLICATIONS

This application claims priority to U.S. Provisional Application No. 61/137,469, filed Jul. 31, 2008 and European Patent Application No. EP08168746 filed Nov. 10, 2008.

FIELD OF THE INVENTION

The invention relates generally to hybrid electronics and more particularly to a pressure sensor module for use in a pressure sensor and more particularly to fluid pressure sensors exposed to acidic environments. The sensor module comprises a sensing element mounted on a front side of a support member. The support member comprises a hole through the support member from the front side to a back side and the sensing element covering the hole at the front side.

BACKGROUND OF THE INVENTION

A pressure sensor module of the above-mentioned type is known from WO2002/079742. The known pressure sensor module is used in a gauge differential pressure sensor configuration. Two identical sensor sensors modules are used to measure the pressure of two media. Each configuration comprises a hole. The hole passes through a substrate which is covered at one side by the sensing element. The other sides of both sensing elements see the same reference pressure, typically atmospheric pressure, due to the fact that they sit in the same chamber. An additional inlet can pass through the housing of the pressure sensor to provide atmospheric pressure to the chamber. In this open configuration, water vapor and other contaminants can freely enter the chamber.

The pressure media, designated as a low and a high pressure, enter the housing through separate pressure inlets and act upon the sensing elements via the hole through the substrate.

Furthermore, similar pressure sensors modules are known wherein the hole through the substrate is filled with an acid resistant gel to isolate the sensing element from contaminants and the acidic environment.

The through hole can be made with laser cutting. Laser cutting of through holes in ceramics is an economical process commonly implemented in hybrid electronics. However, the laser cutting process can damage the inherent acid robustness of the ceramic by creating micro cracks and/or forming more vulnerable phases of the ceramic (i.e. glassy phase) on the surface of the ceramic. When used in an acidic environment, such as diesel exhaust, the untreated laser cut surface may be prone to chemical attack and corrosion. This laser cut surface may be prone to chemical attack and corrosion even when the through holes are potted with a protective coating. This chemical attack and corrosion will change the properties of the protective coating which could result in malfunctioning of the pressure sensor.

SUMMARY OF THE INVENTION

It is an object of the present invention to provide a pressure sensor module with improved robustness to acidic conditions such as those found in exhaust environments.

According to the present invention, the support member of the pressure sensor module further comprises a back side barrier at the back side of the support member, surrounding a surface of the back side of the support member including the hole and forming an enclosed area, wherein the enclosed area and the hole form a pressure channel and, a back side protective member filling the hole and at least partially the enclosed area.

Legislation drives the need for a soot filter in exhaust systems of diesel powered engines used in passenger cars and commercial vehicles. Periodic regeneration of the soot filter is required when the filter gets clogged. For triggering this regeneration process and for satisfying On-Board Diagnostics (OBD) requirements, a pressure drop measurement over the filter is needed. This could be accomplished by a MEMS based differential pressure sensor. The sensing element of a MEMS based differential pressure sensor needs to be protected against the exhaust environment. For this reason a protective gel is used. This gel should provide mechanical isolation against deposits and offers protection of the sensing elements against damaged by frozen water. In the case of a front-side exposed sensing element, this is generally accomplished by placing a gel dam or barrier around the sensing element and filling the chamber formed by the gel dam with a protective gel. To protect the other side sensing element, the walls of hole through the support member are used as gel dam and the chamber formed by the hole is filled with a protective gel.

At one side of the sensing element is acting the exhaust pressure before the soot filter and at the other side of the sensing element is acting the exhaust pressure after the soot filter. It was assumed that the soot filter filters the exhaust so good that the exhaust after soot filter is less aggressive and a through hole filled with protective gel provides sufficient protection for the sensing element for the product life time. The amount of protective gel should be sufficient to protect the sensing element against chemical attacks. However, it has been found that despite the assumed less aggressive exhaust after the soot filter, the gel in the hole of the support at the back side degrades faster than the gel between the gel dam at the front side. The geometric constraints of the through hole are the cause of the faster degradation of the protective gel in the hole. It has been found the protective gel is polluted more near the walls of the hole than in the middle of the hole. The first degradations of the protective gel appear in the area near the point where the surfaces of the ceramics, exhaust and protective gel meet each other. One of the reasons is the structure of the surface of the hole due to the laser cutting process. Without a back side barrier, water pockets will occur in the gel in the narrow through hole. The water pockets comprise $NO_x$-gasses. The water pockets introduce mechanical stress in the gel, which is subsequently acting on the sensing element. Over a longer period, the water pockets degrade the gel in a way that cracks and water bubbles occur in the gel, resulting in a malfunctioning sensor.

A similar degradation mechanism has also been observed in the gel protecting on the other side of the sensing element which is exposed to the exhaust pressure before the soot filter. However the degradation mechanism at this side is much slower, does not start at the edges and does not result in output failures.

According to the present invention, these problems are overcome by means of the back side barrier which is at least partially filled with a protective gel. This enlarges the distance between the surface of the gel exposed to exhaust gas and the walls of the hole. This ensures that water pockets in the gel will appear slower.

Furthermore, even if the gel is polluted, by means of particles or water pockets near the walls of the back side barrier, the effect on the performance of the sensor will be less, as the distance between opposite walls of the back side barrier is larger than the distance between the walls of the hole.

In an embodiment of the invention, a cross section of the hole widens from the back to the front of the support member and in another embodiment, the transition of the surface of the hole to the back side has a smooth shape. The gel is a viscous substance with a high coefficient of thermal expansion (CTE). A change in pressure of the exhaust gas has to be transferred to the sensing element without any loss of signal over a wide temperature range. In case of temperature changes, this feature reduces the mechanical resistance in the pressure channel, as the gel in the hole can expand or contract without creating too much stress on to the sensing element. This in return improves the accuracy and stability of the pressure sensor.

In an embodiment of the invention, the back side barrier is attached to the support member. This feature allows to construct the pressure channel by means of two economically to manufacture components, for example a ceramic printed wiring board (PWvB) and a ceramic ring, which are glued together.

In another embodiment of the invention, the support member and back side barrier are formed by one piece of material, for example ceramic material. This allows to skip the manufacturing step of attaching the gel dam to the support member.

In another embodiment of the invention, the back side barrier is formed by a bead of adhesive.

In an embodiment of the invention, the support member is a ceramic PWB having an electrically conductive element provided at the front side and electrically connected to the sensing element. Preferably, the electrically conductive element comprises noble metals. This feature reduces the influence of acidic conditions due to the exhaust acting on the front-side. Using noble metals further improves the robustness of the conductive elements.

In an embodiment of the invention, the sensing element is a differential pressure sensing element. In a preferred embodiment, the sensing element is a Micro-Electro-Mechanical Systems (MEMS) differential pressure sensing element. This feature allows us to provide an improved differential pressure sensor, which could be used to measure a pressure drop over for example a soot filter in an exhaust system.

In a further embodiment, the sensor further comprises a front side barrier surrounding the sensing element and a front side protective member which has an electrical insulating property and covers the sensing element and the front side between the front side barrier. These features provide a differential pressure sensor with improved robustness to acidic conditions present at both sides of the pressure sensor.

In an embodiment of the invention, the enclosed area on the back side within the back side barrier is larger then the area of the hole in the support member. This allows to fill the pressure channel with enough protection gel to reduce the forming and the effect of pollutants, which could be water pockets, in the gel in the through hole.

In an embodiment of the invention, wherein the minimum thickness of the back side protective member covering the sensing element is larger than the minimum distance between the surface of the sensing element covered by the back side protective member and a plane coinciding with the back side of the support member.

By adding a gel dam to the back side of the support member, optimizing the shape of the through hole, and filing the pressure channel with sufficient protective gel, the ratio of the gel surface versus gel height is increased, the distance between the gel surface and sensing element is increased, the distance between the position where the surface of the gel touches the side wall and the sensing element.

In an embodiment of the invention, edge conditions of the through hole have been improved by a method comprising the steps of:

increasing the temperature of the support at a selected rate from ambient temperature of approximately 25 deg C. to approximately 1300 deg C.+/−100 deg C., maintaining the temperature at approximately 1300 deg C. for approximately one hour, and, decreasing the temperature of the ceramic member at a selected rate to ambient temperature. This process converts a laser subjected surface from a more vulnerable surface texture and/or ceramic phase(s) to a more robust surface texture and/or phase(s) of the ceramic.

In yet another embodiment of the invention, support member is manufactured by means of a sintering process, wherein the hole in formed in the support member by means of a mold. It has been found that the edges of a through hole made by such a process have a less vulnerable surface texture than edges of a through hole made by a laser cutting process.

Another object of the invention is to provide an improved pressure sensor arrangement comprising a housing and a pressure sensor module according to the invention.

BRIEF DESCRIPTION OF THE DRAWINGS

The present invention will be discussed in more detail below, using exemplary embodiments, with reference to the attached drawings, in which

FIG. 5 shows a acid test result after an acid test on a standard laser cut through hole which is not subjected to an anneal process; and, FIG. 6 shows a acid test result after an acid test on a through hole which is subjected to an anneal process and, FIG. 7 illustrates some dimension requirements of the back side protective member.

DETAILED DESCRIPTION OF EXEMPLARY EMBODIMENTS

Figure 1:
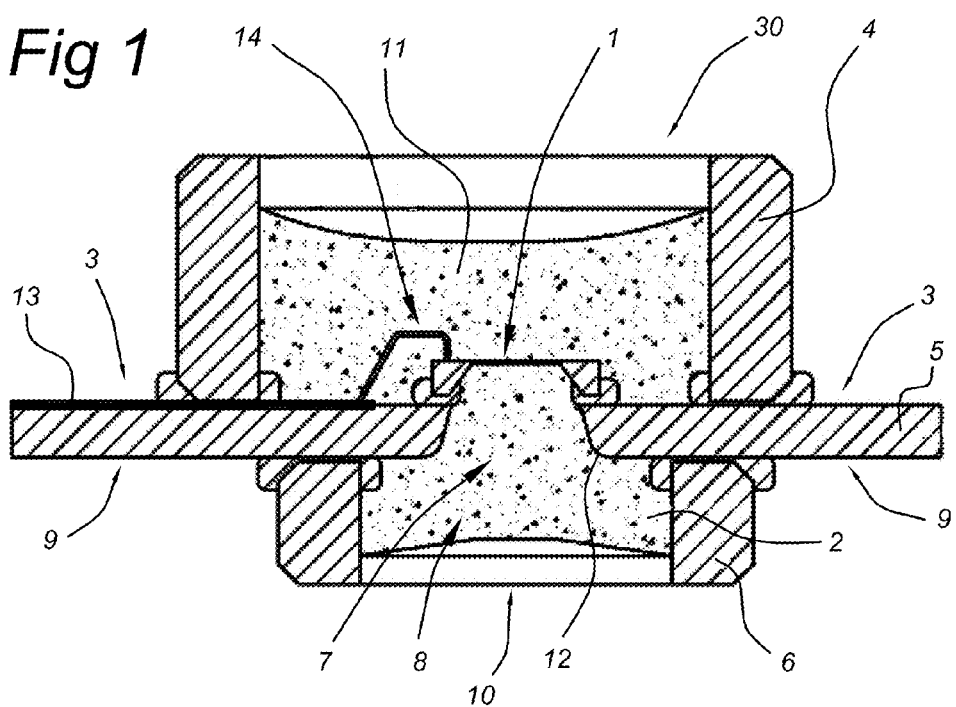
FIG. 1 shows cross sectional view of a pressure sensor module according to a preferred embodiment.
Figure 2:
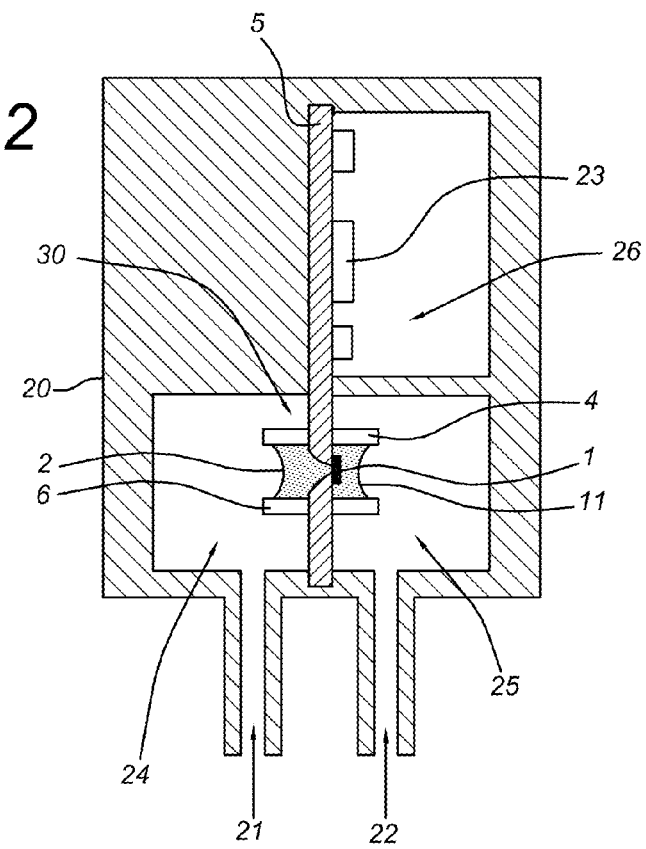
FIG. 2 shows cross sectional view of a pressure sensor arrangement according to a preferred embodiment.

With reference to FIGS. 1 and 2 and according to a preferred embodiment of the invention, a pressure sensor module for measuring fluid pressure in an acidic medium has a fluid pressure responsive sensing element 1 mounted on a front side 3 of a support member 5 over a through hole 7 and a back side barrier 6 or gel dam is disposed around the through hole on the opposite or back side of the support member. The barrier 6 and through hole 7 are preferably filled with a back side protective member 2. This module is meant as a subassembly that has to be fit in a sensor housing before it can be used as a pressure sensor or device. FIG. 2 shows a cross sectional view of pressure sensor arrangement comprising a pressure sensor module 30 according to a preferred embodiment. FIG. 1 shows a cross sectional view of a part of the pressure sensor module shown in FIG. 2. A module 30 can be used as differential pressure sensor, for example, in an exhaust system to measure the pressure drop over a soot filter. The differential pressure is preferably measure by means of a MEMS differential pressure sensing element 1. Such sensors are known in the art. Alternatively, the sensing element 1 can have thin-film, foil gauge or bulk silicon gauge design.

The pressure sensor module 30 is preferably manufactured completely before it is placed in a housing 20 of the pressure sensor arrangement. The housing 20 and pressure sensor module 30 form a first pressure chamber 24 and a second pressure chamber 25. The housing comprises a first inlet 21 through which a first fluid having a first pressure can enter the first pressure chamber 24. The housing comprises further a second inlet 22 through which a second fluid having a second pressure can enter the second pressure chamber 25. The first fluid is for example the exhaust after the soot filter and the second fluid is the exhaust before the soot filter. The housing 20 further comprises a separate cavity 26 for accommodating sensor electronics. The cavity is separated from the first and second pressure chamber to isolate the components of the sensor electronics 23 from the acidic environment of the exhaust gasses.

The sensing element 1 is attached to a front side 3 of a support member 5 by means of a sealant or any other suitable adhesive material. The support member 5 is preferably made of a ceramic material for example a 96% $AL_2O_3$ ceramic material. Alternatively, a support member 5 of a purer $AL_2O_3$ ceramic or other suitable ceramic material could be used. The support member 5 comprises a through hole 7 from the front side 3 of the support member 5 to a back side 9 of the support member 5. The sensing element 1 hermetically covers the hole 7 at the front side 3, to form a seal between both sides of the support member 5. The through hole 7 can be made by means of laser cutting with a CO2 laser. A support with a through hole 7 can also be made by means of a sintering process. The hole 7 is then formed in the support member by means of an extrusion in the mold in a commonly known way. An advantage of forming the hole during the sintering process is that the hole comprises a less vulnerable surface texture and/or ceramic phase than when the hole is made by a laser cutting process.

Another way of creating a through hole 7 in the support is to stamp with a tool through the support prior to firing of the ceramic panel, so called green state punching.

In use, pressures are acting on both sides of the sensing element and the differential pressure results in a change in form of the membrane structure of the sensing element 1. This change in form causes a resistance change in gauges of the sensing elements. Which is amplified and conditioned by sensor electronics 23 mounted on the support member 5.

Wire bonds 14 electrically connect the sensing element 1 to electrically conductive elements, e.g. traces 13 on the support member 5. Preferably, the traces 13 and wire bonds 14 are made of noble metals to improve there characteristics with respect to chemical attack and corrosion due to the acidic environment created by the fluids present at both sides of the support member 5. The support member with electrically conductive elements form a ceramic Printed Wiring Board on which electronic components 23 can be adhered to form electronic circuitry 23. The electronic circuitry is arranged to sense one or more electrical properties of the sensing element and to condition and convert the one or more electrical properties into an output signal for use in the electronic control unit of the vehicle.

The pressure sensor module 30 comprises at the front side 3 of the support member 5 a front side barrier 4. The front side barrier 4 surrounds the sensing element 1 and forms a cavity which is partially filled with a front side protective member 11. The protective member 11 has an electrical insulating property and covers one side of the sensing element 1 and a part of the front side surface between the front side barrier 4. The protective member 11, which is preferably a gel, protects the sensing element 1 from contaminants introduced through the second inlet 22 in the second pressure chamber 25. The front side barrier 4 keeps the front side protective member 11 in place. A "gel" is defined as a colloidal suspension of a liquid in a solid, forming a jelly like material in a more solid form than a solution. The gel is specially selected to accurately transmit pressure in the pressure chamber while isolating the sensing element from harsh surrounding conditions. The gel can be, for example, Shin-Etsu Sifel, which stays soft over a $-40°$ C.$-+135°$ C. temperature range and does not exert additional pressure on the sensing element 1. The gel is preferably resistant to exhaust gasses. The protective member 2 protects the sensing element 1 from condensate of exhaust gasses, which is an acidic condensate. Furthermore, the protective member forms a mechanical isolator for soot particles and other particles that could damage the sensing element 1 and/or could make the sensing element 1 malfunctioning.

The pressure sensor module 30 further comprises at the back side 3 of the support member 5 a back side barrier 6. The back side barrier 6 surrounds the through hole 7 and forms an enclosed area 8 which is partially filled with a back side protective member 2. The back side protective member 2 is a similar substance as the front side protective member 11 having similar properties. The back side protective member 2, which is preferably a gel, protects the sensing element 1 from contaminants introduced through the first inlet 22 in the first pressure chamber 24. The back side barrier 6 keeps the back side protective member 2 in place.

The hole 7 and enclosed area 8 surrounded by the back side barrier 6 form a pressure channel 10. The pressure channel 10 allows to transfer a pressure in the first pressure chamber 24 to act on the sensing element 1.

Figure 3:
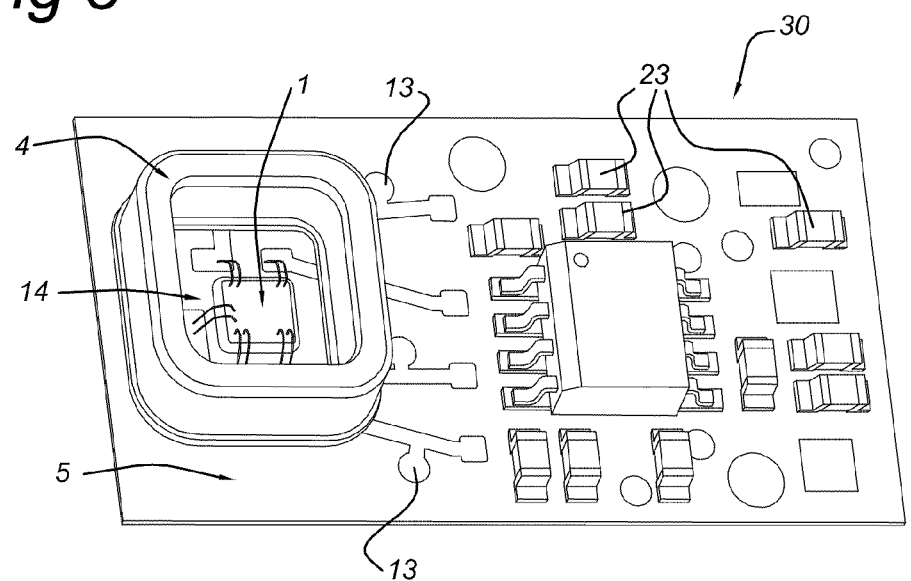
FIG. 3 shows a perspective view of a pressure sensor module assembly.

The front side barrier 4 and back side barrier 6 can be surrounding structure. The shape of the surrounding structure can be substantially squared as illustrated in FIG. 3, substantially cylindrical, or can have any other suitable shape. The barriers 4, 6 are preferably made of the same material as the support member 5. The barriers are preferably made of a ceramic material.

The front side barrier 4 is a structure which is bonded to the support member after the conductive elements 13 or traces are etched on the support member 5. The back side barrier 6 can be a structure which is bonded on the support member 5. In another embodiment, the support member 5 and the back side barrier 6 are formed by one piece of material, for example by means of sintering process.

The front and back side barrier 4, 6 can be a solid member, 96% alumina for example, or an elastomer (flexible member), such as dispensed Sifel 604 adhesive. In case of an elastomer, the barriers 4, 6 can be processed in a discrete dispense and cure step or co-cured with the respective protective members 2, 11.

The through hole 7 in the support member 5 can have edges which are parallel to each other and perpendicular to both the front side 3 and back side 9 of the support member 5. According to the invention, the area of the surface of the back side 9 of the support member 5 encompassed by the back side barrier 6 is larger than the area of the through hole 7 in the surface of the back side 9 of the support member 5. A change in temperature will result in expansion or contraction of the protective member 2 in the pressure channel 10. Adhesion of protective member 2 to the side walls will result in stress due to the thermal expansion or contraction. The shape of a transition surface 12 from the back side surface 9 of the support member 5 to the surface of the through hole 7 will determine the transfer of thermal stress to the sensing element 1.

The thermal stress of the protective member 2 in the pressure channel 10 formed by the through hole 7 and enclosed area 8 of the back side barrier 6 could further be improved by having a through hole 7 which cross section widens from the front side 3 to the back side 9, in other words which cross section widens with increases of distance from the sensing element 1. This feature has further the advantage that it provides a pressure channel which introduces less mechanical stress on the sensing element 1 due to different temperature dependent coefficients of expansion of the used materials.

FIG. 3 shows a perspective view of the front side of a pressure sensor module assembly 30. On the front side of the support member 5 is the sensing element 1. The support member is a ceramic PWB on which conductive elements or traces 13 are etched. The sensing element 1 is electrically connected to conductive elements 13 by means of bonding wires 14. A front side barrier 4 is attached to the front side of the support member 5. The conductive elements 13 pass under the front side barrier 4 to electronic circuitry 23 for converting electrical signals obtained from the sensing element 1 into a signal indicative of the measured differential pressure.

Figure 4:
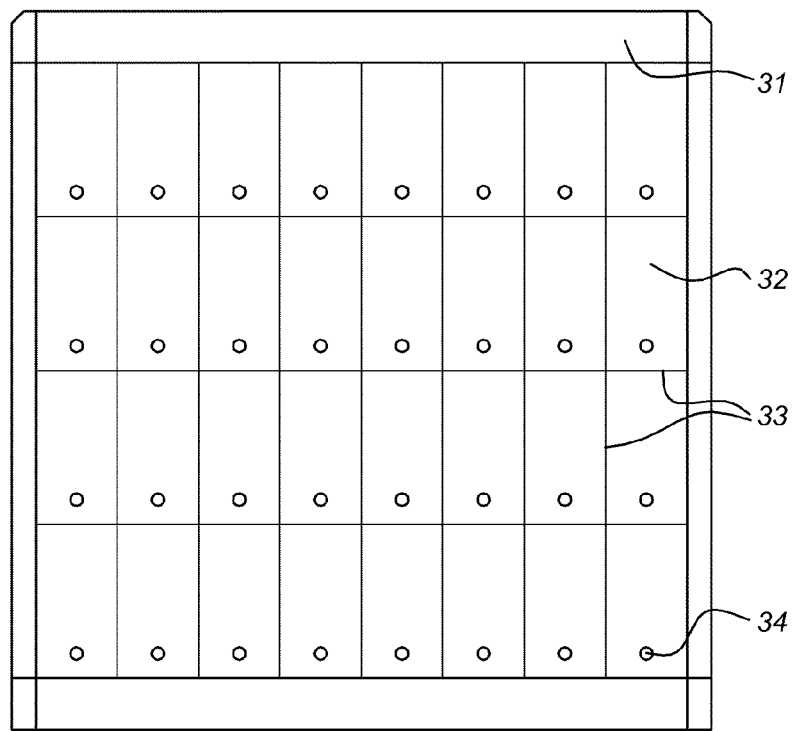
FIG. 4 shows a top plane view of a ceramic substrate in which a plurality of individual ceramic support members have been laser cut and scribed for use in a pressure sensor module.

FIG. 4 shows a top plane view of a ceramic substrate 31 in which a plurality of individual ceramic support members 32 have been laser cut and scribed for use in a pressure sensor module as shown in FIGS. 1-3. The ceramic substrate is suitable for batch processing. References 33 indicate laser scribe lines for separating of the individual ceramic support members 32. Each individual support member 32 comprises a through hole 34 in the ceramic. The through hole 34 is provided for accessing application pressure to reach a sensing element surface that covers the through hole 34 at one side of the ceramic support member 32.

The through holes 34 can be formed there through by laser processing or green state forming, wherein the hole 34 is formed during a sintering process forming the ceramic substrate 31.

According to a further embodiment of the invention, ceramic edge conditions of a ceramic member are changed to improve the robustness to acid for use in acidic environments such as diesel engine exhaust by subjecting the ceramic member to an annealing process to anneal (temperature and time) the laser cut surface to convert the laser subjected surface edge portions from the more vulnerable surface texture and/or ceramic phase(s) to more robust surface texture and/or phase (s) of the ceramic.

FIG. 5 shows a view of one ceramic member having a standard laser cut through hole processed without annealing after being subjected to an acid test that shows evidence 50 of chemical attack on the edges of the ceramic member.

Ceramic substrate members can be formed as follows:

Take 96% $Al_2O_3$ ceramic substrate member (tape cast or roll compacted).

Emulsion applied to control slag produced in laser cutting process.

Through hole formation processed in the ceramic substrate member (laser cutting with CO2 laser).

Scribe formation processed in the ceramic substrate member for singularization at a later stage (pulsed laser cutting with CO2 laser).

Rinsed to remove emulsion.

The annealing process comprises the following steps:

Ramp from ambient (25 deg C.) to annealing temperature following typical 35 deg C./min.

Annealing temperature: 1300 deg C.+/−100 deg C.

Oxygen environment: ambient air is sufficient.

Time for annealing: minimum of one hour.

Ramp from annealing temperature to ambient temperature following typical 35 deg C./min.

After the annealing process the following steps are performed to attach the conductive elements, i.e. traces, and electronic circuitry on the support member:

Thick film printing:

Screen print a first conductor.

First conductor dried.

First conductor fired at 850 deg C.+/−50 deg C.

Screen print a second conductor.

Second conductor dried.

Second conductor fired at 850 deg C.+/−50 deg C.

Screen print dielectric thick film.

Dielectric thick film dried.

Dielectric thick film fired at 850 deg C.+/−50 deg C.

Sensor is then assembled.

Samples were made according to the above described processes and subjected to acid tests along with other conventional samples not subjected to an annealing process as follows.

Test Samples:

Control sample: Standard laser cut through hole formed in 96% alumina ceramic substrate members with MEMS die attached and Sifel (a registered trademark of Shin-Etsu for electronic potting material) 8070 gel filled in back side of the ceramic through hole/back side of the MEMS die.

Annealed test sample: Standard laser cut through hole formed in ceramic substrate member as in control sample but which was additionally subjected to 1300 deg C. for one hour as described above. MEMS die attached and Sifel 8070 gel filled in back side of the ceramic through hole/back side of the MEMS die.

Test Conditions Were as Follows:

Test samples were immersed in a jar of 1.0 pH acid mixture comprising mainly nitric, sulfuric, acetic and formic acids. The samples were thermally cycled in the jar four times from 25 deg C. to 95 deg C. back to 25 deg C. with one hour dwell at 95 deg C. over a total time period of 120 hours. Samples were removed from the acid, rinsed, inspected and images captured as shown in FIGS. 5 and 6.

FIG. 6 shows a view of a ceramic member also having a standard laser cut through hole but processed with post annealing to improve the surface texture and/or promote the development of more acidic robust phase formation of the ceramic and showing no evidence of chemical attack on the edges of the ceramic member after being subjected to the same acid test.

In place of a temperature annealing process, a secondary machining operation, chemical etching or chemical treatment may be employed to improve surface texture and/or remove or reduce the more vulnerable phases of the ceramic member. Green state forming of the through hole in place of laser cutting may also be used with or without a secondary annealing, machining, chemical etching or other chemical treatment to prevent or reduce the formation of the more vulnerable phases of the ceramic member.

FIG. 7 illustrates dimension requirements with respect to the protective member 2 at the back side 9 of the support member 5. The protective member 2 has a concave meniscus in response to the surface of the back side barrier 6. The bottom of the meniscus defines the minimum thickness d1 of the protective member with respect to the sensing element 1. In other words d1 is the minimum distance between the exhaust gas and the surface of the sensing element at the back side 9 through the protective member 2. Furthermore, distance d2 is the minimum distance between the surface of the sensing element 1 covered by the back side protective member 2 and a plane coinciding with the back side of the support member 9. It has been found that an attack by the exhaust gasses on the protective member 2 in the through hole 7, i.e. the presence of water pockets is reduced significantly if the minimum thickness d1 is equal to or larger than d2. This requirement ensures that the surface of the back side 9 of the support member 5 between back side barrier 6 is covered with some protective gel. As the first indications of degradation of the protective member are found in the protective member 2 near the position where meniscus touches the back side barrier, it will take more time before the protective member in the through hole 7 is degraded. This extends the lifetime of the pressure sensor.

The above described embodiments relate to a differential pressure sensor module. It should be noted, that the invention could be used to provide an improved acid-resistant pressure sensor. In that case a pressure sensor arrangement can comprises only the first pressure chamber 24 having an inlet 21 to allow a pressurized acidic fluid to access the first pressure chamber 24. The pressure is acting through the through hole 7 on one side of the sensing element 1. A predefined and conditioned pressure is acting on the other side of the sensing element. This predefined and conditioned pressure is from a non-acidic environment. This allows us to use less expensive materials for the bonding wires 14 and electrically conductive elements 13. Furthermore, no front side barrier 4 and front side protective member 11 is needed to protect the front side 3 of the pressure sensor module 30 for an acidic and contaminated environment. Such a pressure sensor module has the advantage that it can be manufactured and tested before it is finally placed in a sensor housing.

Disclosed is an alternative geometry of a pressure channel or gel chamber on the back side of a sensor module. The alternative geometry provides an improved pressure sensor module with improved robustness to acidic conditions on the back side of the sensor module. This is accomplished by adding a gel dam or barrier to the back side of the support member and optimizing the shape and/or dimensions of the pressure channel and the amount of gel. The gel dam enables us 1) to increase the ratio of the gel surface versus the gel height, i.e. the minimum distance between the exhaust gas and the sensing element, 2) to increase the distance between the meniscus and the sensing element, 3) to increase the distance between the points where the meniscus of the gel touches the side wall of the pressure channel and the sensing element, and 4) to eliminate possible nucleation sites in the gel in the through hole. Each of these improves the robustness of the pressure sensor module to acidic conditions such as those found in exhaust environments.

Several embodiments of the invention have been described above by way of exemplary embodiments. Various modifications and variations for the elements described with respect of these embodiments may be made by the skilled person without departing from the scope of the present invention, which is defined by the appended claims.

The invention claimed is:

1. A pressure sensor module for use in a pressure sensor, the pressure sensor module comprising:
    a sensing element mounted on a front side of a support member;
    the support member comprising a hole through the support member from the front side to a back side and the sensing element covering the hole at the front side;
    a back side barrier at the back side of the support member, surrounding a surface of the back side of the support member and forming an enclosed area, wherein the enclosed area and the hole form a pressure channel; and,
    a back side protective member filling the hole and at least partially the enclosed area;
    wherein edge conditions of the through hole have been improved by a method comprising the steps of:
    Increasing the temperature of the support at a selected rate from ambient temperature of approximately 25 deg C. to approximately 1300 deg C.+/−100 deg C.,
    maintaining the temperature at approximately 1300 deg C. for approximately one hour, and
    degreasing the temperature of the ceramic member at a selected rate to ambient temperature.

2. A pressure sensor module according to claim 1, wherein a cross section of the hole widens from the front side to the back side.

3. A pressure sensor module according to claim 1, wherein the transition of the surface of the hole to the back side has a smooth shape.

4. A pressure sensor module according to claim 1, wherein the back side barrier is attached to the support member.

5. A pressure sensor module according to claim 1, wherein the support member and back side barrier are formed by one piece of material.

6. A pressure sensor module according to claim 1, wherein the support member is a ceramic PWB having an electrically conductive element provided at the front side and electrically connected to the sensing element.

7. A pressure sensor module according to claim 6, wherein the electrically conductive element comprises noble metals.

8. A pressure sensor module according to claim 1, wherein the sensing element is a differential pressure sensing element.

9. A pressure sensor module according to claim 8, wherein the sensing element is a MEMS differential pressure sensing element.

10. A pressure sensor module according to claim 8, wherein the sensor further comprises:
    a front side barrier surrounding the sensing element; and
    a front side protective member which has an electrical insulating property and covers the sensing element and the front side between the front side barrier.

11. A pressure sensor module according to claim 1, wherein the enclosed area on the back side within the back side barrier is larger then the area of the hole in the support member.

12. A pressure sensor module according to claim 11, wherein the minimum thickness of the back side protective member covering the sensing element is larger than the minimum distance between the surface of the sensing element covered by the back side protective member and a plane coinciding with the back side of the support member.

13. A pressure sensor module according to claim 1, wherein the support member is manufactured by means of an injection molding process, wherein the hole is formed in the support member by means of a mold.

14. A pressure sensor arrangement comprising a housing and a pressure sensor module according to claim 1.

15. A pressure sensor module for use in a pressure sensor, the pressure sensor module comprising:
    a sensing element mounted on a front side of a ceramic support member, the support member having a hole through the ceramic support member from the front side to a back side forming surface edge portions, the sensing element covering the hole at the front side; characterized in that said surface edge portions of the through hole are treated by a method comprising the steps of:

increasing the temperature of the support at a selected rate from ambient temperature of approximately 25 deg C. to approximately 1300 deg C.+/−100 deg C., maintaining the temperature at approximately 1300 deg C. for approximately one hour, and, decreasing the temperature of the ceramic member at a selected rate to ambient temperature.

16. A pressure sensor according to claim 15 further including a back side barrier attached at the back side of the support member surrounding a surface of the back side of the support member and forming an enclosed area, wherein the enclosed area and the hole form a pressure channel, and a back side protective member filling the hole and at least partially the enclosed area.

17. A pressure sensor arrangement comprising a housing and pressure sensor module according to claim 15.

* * * * *